United States Patent
Tong et al.

(10) Patent No.: US 7,884,036 B1
(45) Date of Patent: Feb. 8, 2011

(54) METHODS FOR TREATING SUBSTRATES IN PREPARATION FOR SUBSEQUENT PROCESSES

(75) Inventors: Jinhong Tong, Santa Clara, CA (US); Anh Duong, Union City, CA (US); Zhi-Wen Sun, San Jose, CA (US); Chi-I Lang, Cupertino, CA (US); Sandra Malhotra, San Jose, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 521 days.

(21) Appl. No.: 11/777,152

(22) Filed: Jul. 12, 2007

(51) Int. Cl.
*H01L 21/00* (2006.01)

(52) U.S. Cl. ............ 438/798; 438/597; 438/758; 438/795; 257/E21.001

(58) Field of Classification Search ........... 438/798, 438/758, 795; 257/E21.001
See application file for complete search history.

(56) References Cited

U.S. PATENT DOCUMENTS

| | | | |
|---|---|---|---|
| 5,962,341 A * | 10/1999 | Ito .................... | 438/692 |
| 6,429,115 B1 * | 8/2002 | Tsai et al. ............. | 438/622 |
| 6,677,251 B1 * | 1/2004 | Lu et al. ................ | 438/778 |
| 2003/0082924 A1 * | 5/2003 | Andideh et al. ........ | 438/778 |
| 2003/0219970 A1 * | 11/2003 | Delamarche et al. .... | 438/622 |
| 2004/0050685 A1 * | 3/2004 | Yara et al. .............. | 204/164 |
| 2006/0141778 A1 * | 6/2006 | Tonegawa et al. ....... | 438/638 |
| 2006/0148192 A1 * | 7/2006 | Chou et al. ............ | 438/396 |

* cited by examiner

*Primary Examiner*—Charles D Garber
*Assistant Examiner*—Angel Roman

(57) ABSTRACT

Methods for treating a substrate in preparation for a subsequent process are presented, the method including: receiving the substrate, the substrate comprising conductive regions and dielectric regions; and applying an oxidizing agent to the substrate in a manner so that the dielectric regions are oxidized to become increasingly hydrophilic to enable access to the conductive regions in the subsequent process, wherein the dielectric region is treated to a depth in the range of approximately 1 to 5 atomic layers. In some embodiments, methods further include processing the substrate, wherein processing the conductive regions are selectively enhanced. In some embodiments, the oxidizing agent includes atmospheric pressure plasma and UV radiation.

18 Claims, 10 Drawing Sheets

METHODS FOR TREATING SUBSTRATES IN PREPARATION FOR SUBSEQUENT PROCESSES

BACKGROUND

The present invention relates to processes for manufacturing substrates and, more particularly, to processes suited for mass production of a highly integrated semiconductor devices.

As demand for smaller, more densely featured semiconductor devices increases, methods for improving device manufacturability and reliability are constantly evolving. Manufacturing a modern semiconductor device requires many steps or processes. These processes include a myriad of additive and subtractive processes which deposit or remove material stacks to and from a semiconductor device. In addition, one or more cleaning process may be necessary to prepare a semiconductor device for each additive or subtractive process. In some examples, manufacturing complications may arise because surfaces of a semiconductor device are typically not homogenous. That is, a semiconductor device's surface may include any number of metals or dielectric materials. Further manufacturing complications may arise because dielectric and metal lines may be extensively interleaved on a semiconductor device surface. Extensive interleaving of different materials may result in undesirable side interactions that disrupt manufacturing processes. For example, in a deposition process, it may be desirable to deposit material only on a conductive region or a dielectric region, but not both. Extensive interleaving of disparate materials may hinder selective reactivity because the physical properties of one material may adversely affect a reaction on another material. Thus, selective reactivity may be difficult or impossible to achieve.

At least some methods for achieving selective reactivity focus on selecting reactions targeted toward the more reactive surface. For example, one skilled in the art will recognize that conductive regions are typically more reactive than dielectric regions. As such, many prior art solutions have relied on utilizing reactants that interact with the more highly reactive conductive region. Unfortunately, side reactions on adjacent dielectric regions may poison a deposition layer thus rendering a semiconductor device unreliable. This phenomenon is particularly prevalent in wet process applications. In wet processes, surface molecules on a dielectric region may act as nucleation sites that result in material deposition or particle formation on the dielectric region. In addition, dielectric regions are often hydrophobic, which may decrease the wetted surface of adjacent conductive regions. As a result of these characteristics, film morphology may suffer due at least in part to undesirable particle formation on dielectric regions and incomplete reaction on conductive regions. In some instances, cleans or pre-cleans may be required to remove undesirable deposited materials, which may, in turn, add to manufacturing time and cost.

It may also be appreciated that many processes in semiconductor manufacturing require extreme operating conditions or hazardous materials to achieve desired results. For example, Physical Vapor Deposition (PVD) describes a family of thin-film coating processes which are applied under vacuum conditions of $10^{-2}$ to $10^{-4}$ Torr. Another example of a process requiring extreme operating conditions is Chemical Vapor Deposition (CVD). CVD is a thin-film coating with a diffusion type bond that results from the reaction between various gaseous phases and the heated surface of a substrate. CVD is sometimes referred to as a "hot coating" because the process approaches temperatures around 1900° F. One example of a process utilizing hazardous materials is pre-cleaning. Pre-cleaning is a type of process that typically utilizes large amounts of variant acid/base or organic solvents, which, in some examples, may be highly corrosive. Although all of these processes have found wide acceptability in the industry, their use often requires specialized tooling and handling requirements to avoid operator exposure and environmental contamination. In addition, these processes are often time-consuming, which may further add manufacturing time and costs.

Methods which improved selective reactivity of target surfaces to enhance film morphology and reduce undesirable particle formation, which do not require extreme operating conditions or hazardous materials may be desirable. As such, methods for treating substrates in preparation for subsequent processes are presented herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
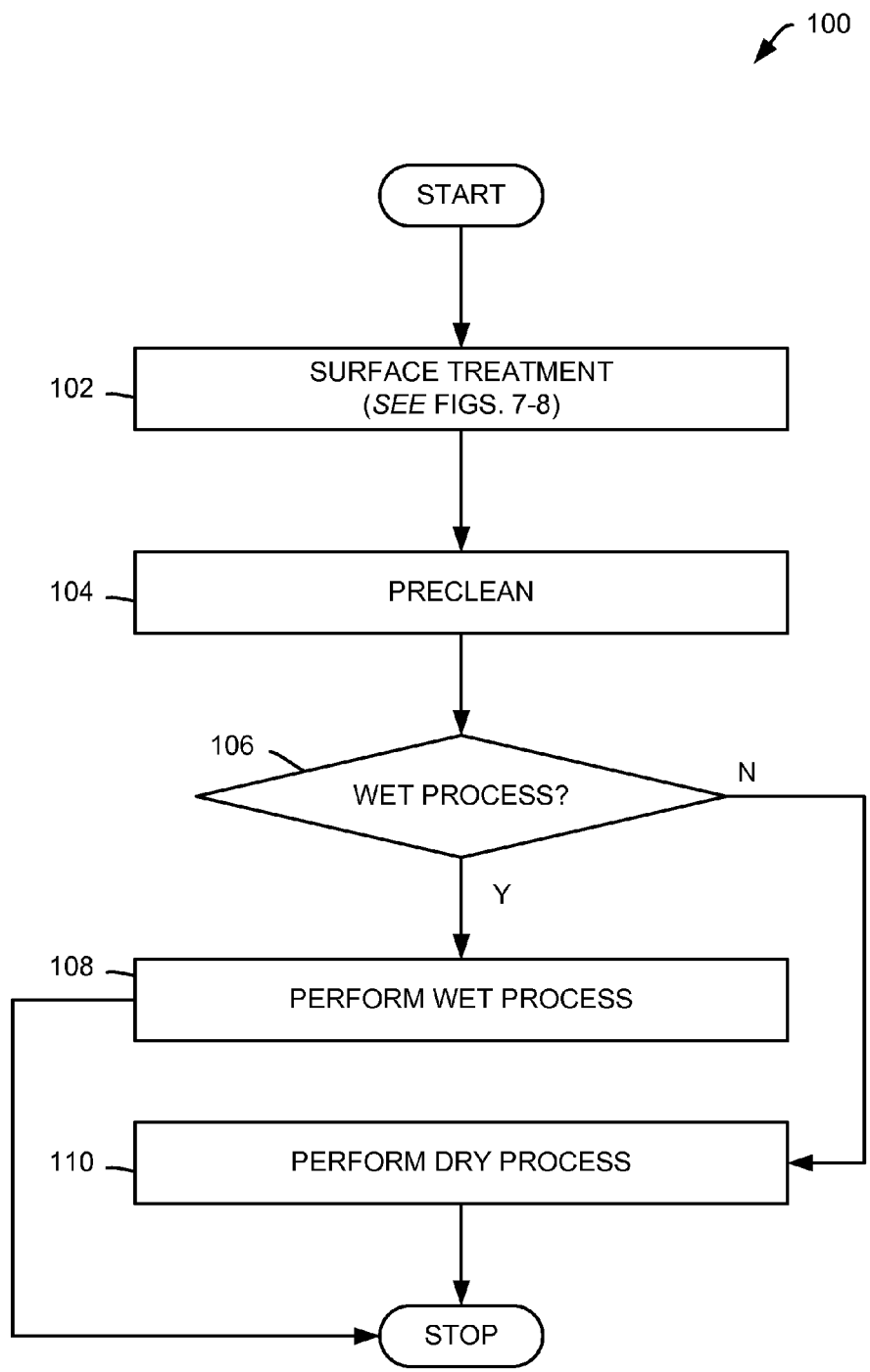
FIG. 1 is an illustrative flow chart of methods for treating substrate surfaces in preparation for subsequent processes in accordance with embodiments of the present invention.

FIG. 1 is an illustrative flow chart 100 of methods for treating substrate surfaces in preparation for subsequent processes in accordance with embodiments of the present invention. At a first step 102, the method treats a substrate surface utilizing methods described herein. As may be appreciated, a substrate may include dielectric regions only or dielectric regions interleaved with conductive regions without departing from the present invention. A substrate surface may be treated to within several atomic layers utilizing an oxidizing agent in embodiments described herein. As is well-known in the art, substances that have the ability to oxidize other substances are said to be oxidative and are known as oxidizing agents, oxidants, or oxidizers, which terms may be utilized synonymously and without limitation. As used herein, an oxidizing agent causes a substrate to receive an oxygen atom. In embodiments described herein, pre-treatment surface groups may be replaced with —OH groups. Surface groups will be described in further detail below for FIG. 4. Embodiments described herein limit surface treatment to several atomic layers to avoid or minimize damage to dielectric regions being treated. In addition, embodiments described avoid undesirable reactions that may otherwise occur on conductive regions when those regions are exposed to oxidizing agents.

A surface treatment may increase the hydrophilic nature of the semiconductor device surface. For example, the wettability of the surface may improve, allowing wet processes better access to conductive surfaces. The surface treatment may result in greater coverage of a capping layer deposited on a conductive surface, for example. Methods of treatment will be discussed in further detail below for FIGS. 2-5 AND 7-8 and may include plasma treatments (e.g., atmospheric pressure plasma treatments) and ultraviolet (UV) treatments. Although some uses of plasma and UV light may result in creation of ozone and ozone related agents, it is nevertheless, intended that embodiments described herein are substantially ozone free. At a next step 104, the method pre-cleans the substrate. Pre-cleaning is a type of process that typically utilizes large amounts of variant acid/base or organic solvents, which, in some examples, may be highly corrosive. Pre-cleaning typically prepares a conductive region for a subsequent reaction. In one embodiment, for example, a pre-clean may remove an oxidized layer on a conductive region in preparation for an electroless deposition step. In one embodiment, a CuO layer may be removed. Any pre-cleaning process known in the art may be utilized without limitation without departing from the present invention.

At a next step 106, the method determines whether a wet process is to be utilized. If the method determines at a step 106 that a wet process is to be utilized, the method continues to a step 108 to perform a wet process. Embodiments described herein are particularly suited to wet processes, such as: an aqueous process, an electrochemical deposition process, a cleaning process, a pre-chemical mechanical planarization (CMP) cleaning process, a post-CMP cleaning process, a via cleaning process, a contact cleaning process, a trench cleaning process, a metallization process, and an electroless (ELESS) deposition process. ELESS deposition is the chemical coating of a conductive material onto a base material surface by reduction of metal ions in a chemical solution without utilizing electrodes as compared to electroplating, which utilizes electrodes in a conductive solution. In some embodiments, ELESS deposition is utilized to deposit a capping layer, such as a Co or Ni layer, or an alloy such as CoWB, CoWPB, or other alloy on a conductive region of a substrate. In another embodiment, a molecular masking layer (MML) process may be utilized for deposition onto a dielectric region made reactive by methods provided herein. Because a dielectric region is rendered hydrophilic, wet deposition processes may be utilized to selectively react with a dielectric region. Thus, any wet process known in the art may be utilized without limitation without departing from the present invention.

If the method determines at a step 106 that a wet process is not to be utilized, the method proceeds to a step 110 to perform a dry process. In some embodiments, the method utilizes an atomic layer deposition (ALD) process. ALD is a coating process capable of depositing ultra-thin, conformal films of a variety of materials. Compared to traditional CVD processes, ALD allows for angstrom-level thickness control with super-conformal films. One advantage of an ALD process is that it can be carried out at temperatures significantly cooler than typical CVD temperatures. For example, alumina films may be deposited between 100 and 200° C., which allows for coating composite devices. In other embodiments, the method utilizes a chemical vapor deposition (CVD). As noted above, CVD is a thin-film coating with a diffusion type bond that results from the reaction between various gaseous phases and the heated surface of a substrate. CVD is sometimes referred to as a "hot coating" because the process approaches temperatures around 1900° F. Once the method has performed all processes, the method ends.

Figure 2:
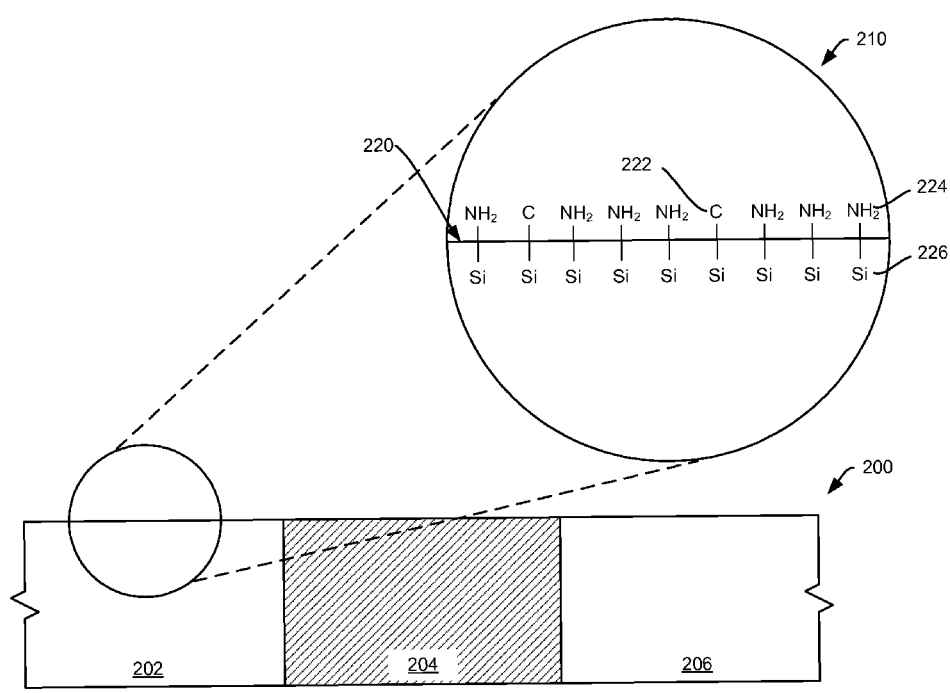
FIG. 2 is an illustrative representation of a substrate and an exploded view of a dielectric region in accordance with embodiments of the present invention.

FIG. 2 is an illustrative representation of a substrate 200 and an exploded view 210 of a dielectric region in accordance with embodiments of the present invention. Substrate 200 may include any number of dielectric regions 202 and 206 and conductive regions 204, which may be interleaved and configured in any fashion without departing from the present invention. As illustrated, regions 202, 204, and 206 are substantially coplanar. It may be appreciated that regions 202-206 may be slightly recessed or elevated due to cleaning. In some embodiments, a chemical mechanical polishing (CMP) step may precede a treatment step. In other embodiments, surfaces are not coplanar and may include any number of features (e.g., via, hole, trench, and damascene structures) without departing from the present invention. In some embodiments, dielectric regions may be composed of materials including: SiCN, SiCNH, SiCH$_3$, SiOCH$_3$, SiH, SiCOH, porous SiCOH, SiN, SiC, SiO$_2$, and low-κ dielectric material. In some embodiments, dielectric regions may have dielectric constants less than that of silicon dioxide (SiO$_2$). For example, some dielectric regions may have a κ value <3.9; some dielectric regions may have a κ value <3.0 (low κ); and some dielectric regions may have a κ value <2.5 (ultra-low κ) without departing from the present invention.

After cleaning processes, dielectric regions may include surface groups 222-224 bonded with silicon matrix 226 along surface 220. Surface groups may include a —C group and a —NH$_2$ group. If left untreated, surface groups 222-224 may promote undesirable nucleation sites which may enhance undesirable ELESS deposition on dielectric regions. Where a capping layer, such as CoWPB, is deposited on a conductive region using an ELESS deposition process, undesired deposition on dielectric regions may lead to current leakage and capacitance increases resulting in a degradation of a CoWPB capping layer performance. In addition, surface groups as described, are inherently hydrophobic and may degrade ELESS deposition on a conductive region.

Figure 3A:
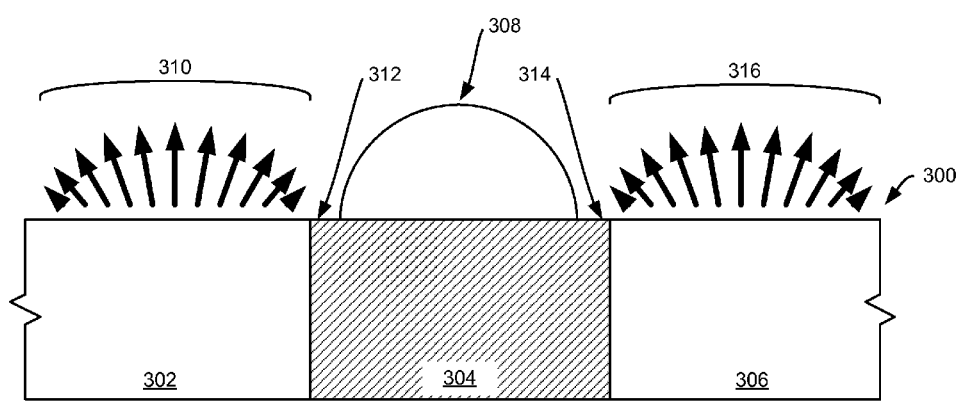
FIGS. 3A-B are illustrative representations of substrates having hydrophobic dielectric regions in accordance with embodiments of the present invention.

For example, FIG. 3A is an illustrative representation of a substrate 300 having a hydrophobic dielectric region in accordance with embodiments of the present invention. As noted above, dielectric regions 302 and 306 may be interleaved with conductive region 304. Dielectric regions of dielectric regions 302 and 306 include surface groups as described above. These surfaces groups may be inherently hydrophobic as indicated by arrows 310 and 316. An effect of hydrophobic surfaces is illustrated by the formation of droplet 308. As illustrated, the wetted surface of conductive region 304 by droplet 308 may be decreased at interface areas indicated by arrows 312 and 314 due to the hydrophobic nature of dielectric regions 302 and 306. Wetting describes the contact between a fluid and a surface, when the two are brought into contact. When a liquid has a high surface tension (strong internal bonds), it will form a droplet such as illustrated by droplet 308. In contrast, a liquid with low surface tension will spread out over a greater area (bonding to a surface). The primary measurement to determine wettability is a contact angle measurement. Contact angle measures the angle between the solid surface and the liquid droplet surface. For example, a droplet formed on a surface would have a high contact angle, but a liquid spread on a surface would have a small contact angle. In this illustration, the contact angle with respect to conductive region 304 is high. Thus, a droplet 308 tends to form on conductive region 304.

Figure 3B:
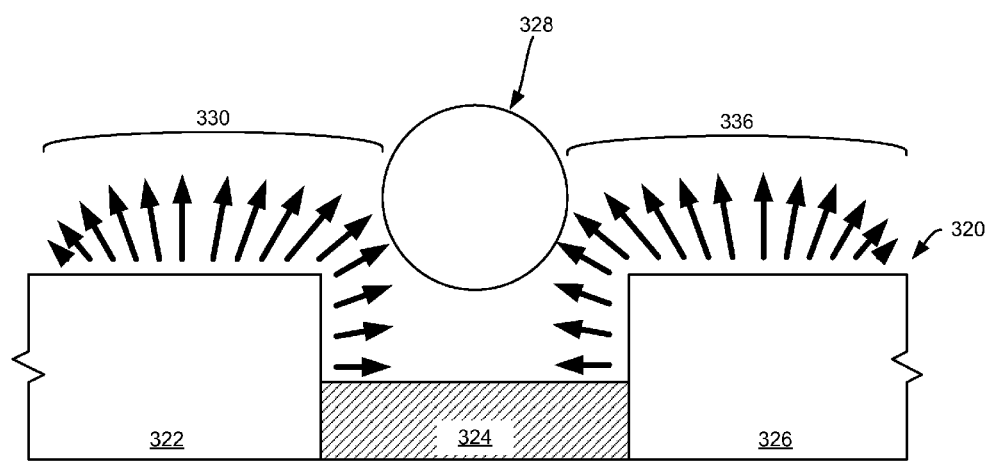

FIG. 3B is an additional illustrative representation of a substrate 320 having a hydrophobic dielectric region in accordance with embodiments of the present invention. As may be appreciated, any number of topographical features may be encountered on a substrate during manufacturing processes. One such feature is a via, which is illustrated here. It may be noted that illustrations utilized herein are to clarify embodiments of the present invention and are not necessarily drawn to a particular scale. As such, no limitations as to scale or size of illustrated features are intended. A via is a hole etched in a dielectric region, which may then be filled with a conductive material, such as a metal. In some examples, a via may be so small that adjacent hydrophobic surfaces may adversely affect subsequent wet processes, such as a post via etch clean selected to react with the via. Additionally, other very narrow topographical features (e.g., features having high aspect ratios) such as a trench or damascene structure may be similarly affected by hydrophobic regions. As noted above, dielectric regions 322 and 326 may be interleaved with conductive region 324. In this illustration, conductive region 324 is recessed with respect to dielectric regions 322 and 326 as in a via. Dielectric regions of dielectric regions 322 and 326 include surface groups as described above. These surfaces groups may be inherently hydrophobic as indicated by arrows 330 and 336. As illustrated, in very narrow features, access to surface of conductive region 324 by droplet 328 may be partially or wholly prevented due to the hydrophobic nature of dielectric regions 322 and 326. In this illustration, droplet 328 is completely prevented from reaching conductive region 324 and the sides of the dielectric regions 322 and 326. Thus, subsequent reactions intended to target conductive region 324 and sides of the dielectric regions 322 and 326 may not fully occur. For example, some post-via etch clean processes may be inhibited from removing contaminants from the sides of the dielectric regions 322 and 326 (i.e., inside the via) and from the surface of the conductive region 324 by hydrophobic forces.

Figure 4:
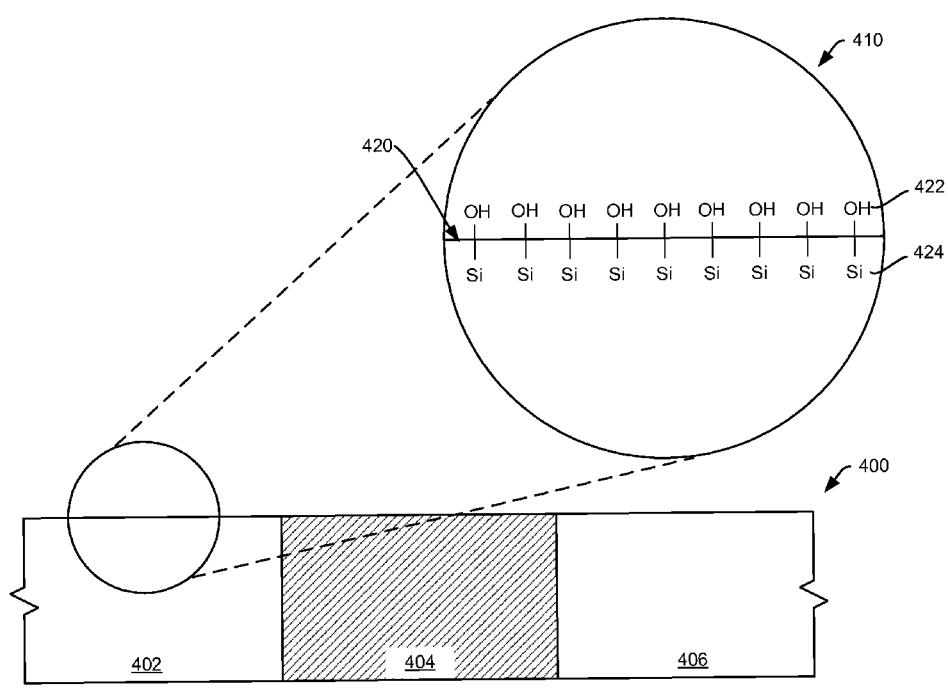
FIG. 4 is an illustrative representation of a substrate and an exploded view of a dielectric region after surface treatment in accordance with embodiments of the present invention.

FIG. 4 is an illustrative representation of a substrate 400 and an exploded view 410 of a dielectric region after surface treatment in accordance with embodiments of the present invention. Substrate 400 may include any number of dielectric regions 402 and 406 and conductive region 404, which may be interleaved and configured in any fashion without departing from the present invention. Exploded view 410 particularly illustrates differences in dielectric region 420 after surface treatment. In particular, pre-treatment surface groups —C and —NH$_2$ (see FIG. 2) have been replaced with surface group —OH 422 that is connected with silicon matrix 424 along surface 420 through surface treatment of dielectric region 420 with an oxidizing agent; however, it is important to note that not all of the sites need to be replaced by the —OH surface group but only a sufficient enough number to enable subsequent processing step(s). In other embodiments utilizing fluorinated reactant gases such as Tetrafluoromethane and Sulfur Hexafluoride in an atmospheric pressure plasma formulation, pre-treatment surface groups having —H atoms may be induced to substitute an —F atom for —H atoms rendering a highly hydrophobic and chemically inert surface. Thus, surface treatments may also be selected to render dielectric region 420 hydrophilic or hydrophobic while leaving conductive region 404 substantially unaffected. A result of surface treatment rendering a surface hydrophilic is further illustrated below for FIG. 5.

Figure 5A:
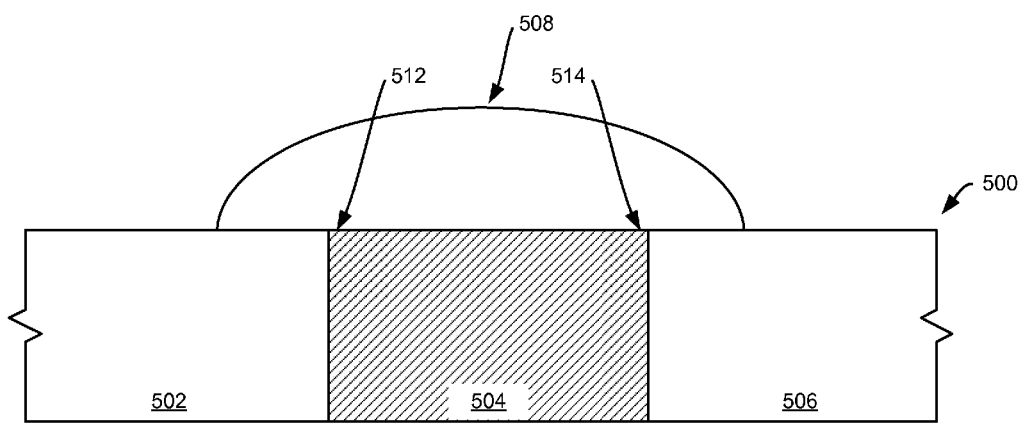
FIGS. 5A-B are illustrative representations of substrates having hydrophilic dielectric regions after surface treatment in accordance with embodiments of the present invention.

FIG. 5A is an illustrative representation of a substrate 500 having a hydrophilic dielectric region in accordance with embodiments of the present invention. In particular, FIG. 5A illustrates FIG. 3A after utilizing embodiments of the present invention. As noted above, dielectric regions 502 and 506 may be interleaved with conductive region 504. In addition, treated portions of dielectric regions 502 and 506, after utilizing methods described herein, include hydrophilic surface group —OH. One result of the treatment is that the contact angle of the droplet has been significantly lowered such that droplet 508 now completely wets interface areas indicated by arrows 512 and 514. Furthermore, nucleation sites have been reduced as a result of the treatment, so undesired deposition on dielectric regions 502 and 504 may be diminished. It may be appreciated that the illustrated representations are not drawn to scale and should, therefore, not be interpreted as so limiting. Rather, the illustrated representations are presented in order to better clarify functional results of the methods provided herein.

Figure 5B:
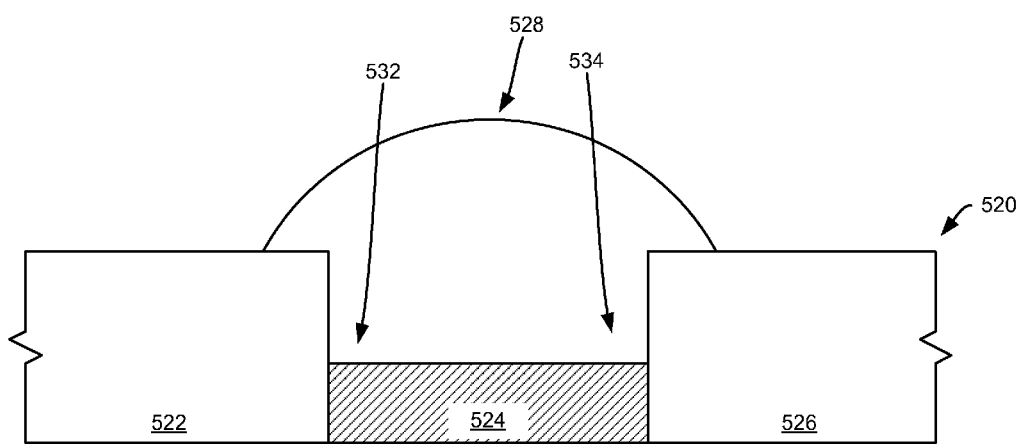

FIG. 5B is an additional illustrative representation of a substrate 520 having a hydrophilic dielectric region in accordance with embodiments of the present invention. In particular, FIG. 5B illustrates FIG. 3B after utilizing embodiments of the present invention. As noted above, topographical features, such as a via, may be so small or narrow that adjacent hydrophobic surfaces may adversely affect subsequent wet processes, such as a post via etch clean, selected to react with the via. Utilizing methods described herein, small or narrow topographical features may be better accessed for selected processes. As illustrated, dielectric regions 522 and 526 may be interleaved with conductive region 524. In addition, treated portions of dielectric regions 522 and 526, after utilizing methods described herein, include hydrophilic surface group —OH. One result of the treatment is that the contact angle of the droplet has been significantly lowered such that droplet 528 now completely wets interface areas indicated by arrows 532 and 534 thus providing improved access to small or narrow topological features such as a via. Furthermore, nucleation sites have been reduced as a result of the treatment, so undesired deposition on dielectric regions 522 and 524 may be diminished. It may be appreciated that the illustrated representations are not drawn to scale and should, therefore, not be interpreted as so limiting. Rather, the illustrated representations are presented in order to better clarify functional results of the methods provided herein.

Figure 6A:
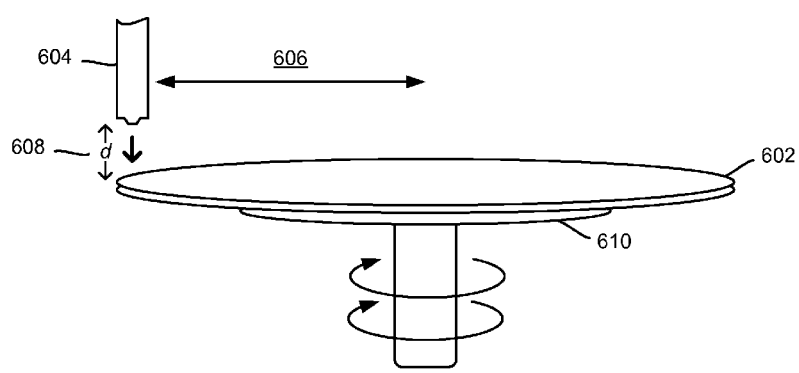
FIGS. 6A-6B are illustrative representations of mechanisms by which a substrate may be treated in accordance with embodiments of the present invention.
Figure 6B:
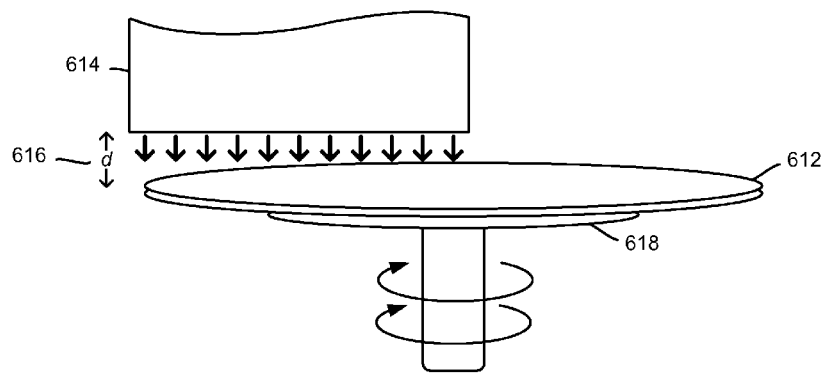

FIGS. 6A-6B are illustrative representations of mechanisms by which a substrate may be treated in accordance with embodiments of the present invention. As illustrated in FIG. 6A substrate 602 may be rotated on pedestal 610. Applicator 604 may be configured to provide an oxidizing agent such as atmospheric pressure plasma or UV radiation from a source (not shown) without limitation and without departing from the present invention. As noted above, although some uses of plasma and UV light may result in creation of ozone and ozone related agents, it is nevertheless, intended that embodiments described herein are substantially ozone free. Applicator 604 may be moved laterally across substrate 602 along axis 606 at distance (d) 608 from substrate 602. In some embodiments, distance (d) is in the range of approximately 5 to 30 mm. Applicator movement and pedestal rotation may be accomplished in any manner well-known in the art without departing from the present invention. Atmospheric pressure plasma may be provided utilizing any source well-known in the art without departing from the present invention. In one example, applicator 604, may deliver plasma from a source utilizing an Atomflo Atmospheric pressure plasma product by Surfx Technologies LLC of Culver City, Calif.

As illustrated in FIG. 6B, substrate 612 may be rotated on pedestal 618. Applicator 614 may be configured to provide an oxidizing agent such as atmospheric pressure plasma or UV radiation from a source (not shown) without limitation and without departing from the present invention. As illustrated, applicator 614 spans approximately ½ the diameter of substrate 612. As such, no lateral movement is required. Applicator 614 may be positioned above substrate 612 at distance (d) 616. In some embodiments, distance (d) is in the range of approximately 5 to 30 mm. As above, applicator movement and pedestal rotation may be accomplished in any manner well-known in the art without departing from the present invention.

Operational Parameters

As may be appreciated, surface treatment of a dielectric region should not interfere with any operational characteristics of the dielectric region. For example, sub-surface treatment could result in κ damage to a dielectric region that might render a semiconductor device unreliable or unusable. Thus, in some embodiments, methods described herein treat surfaces to a range of approximately 1 to 5 atomic layers. This range of specificity is accomplished by controlling operational application parameters of the oxidizing agent. In embodiments described herein, an oxidizing agent may be atmospheric pressure plasma or UV radiation.

Atmospheric Pressure Plasma

Figure 7:
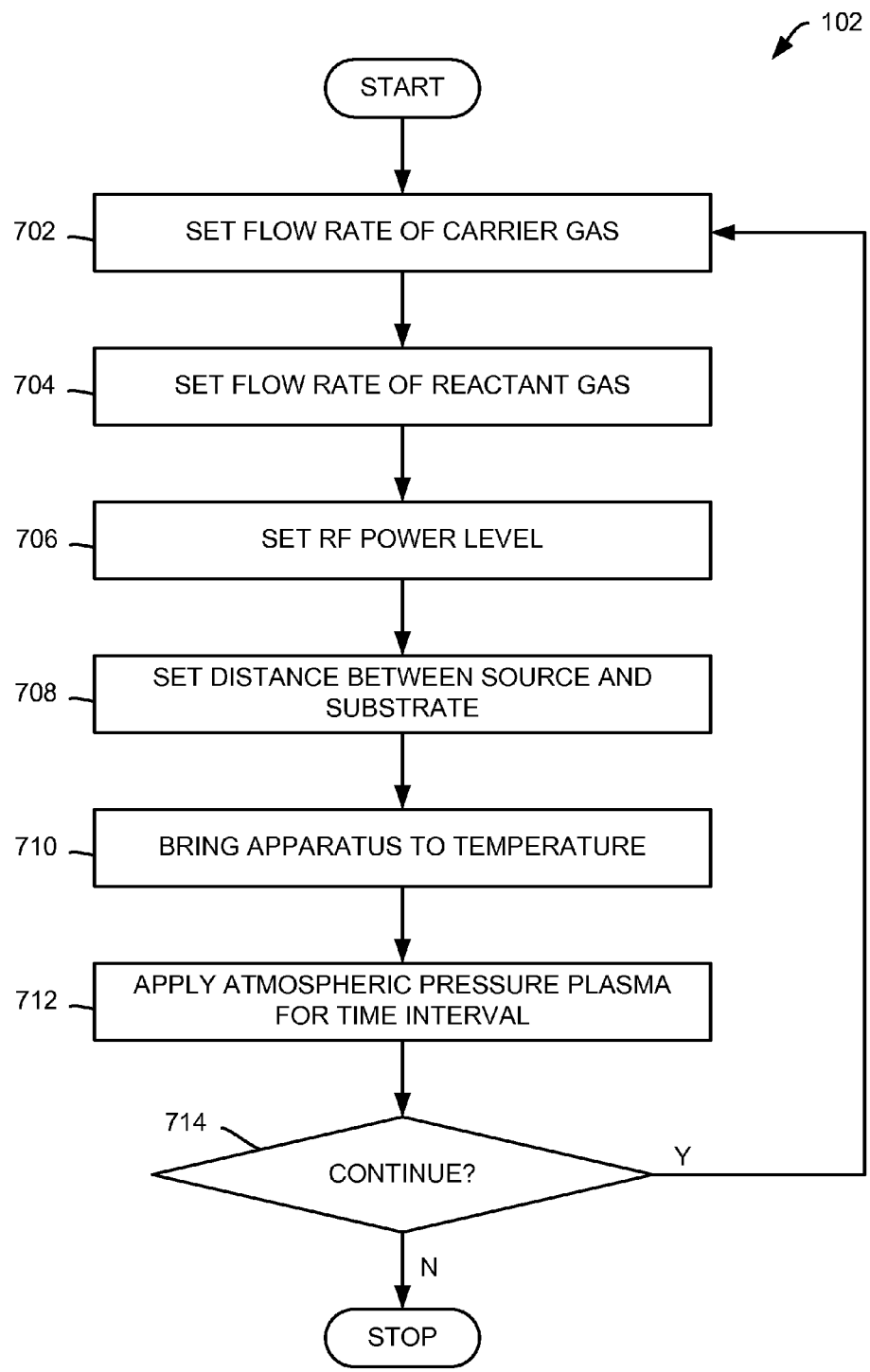
FIG. 7 is an illustrative flow chart of methods for applying atmospheric pressure plasma to a substrate in accordance with embodiments of the present invention.

FIG. 7 is an illustrative flow chart 102 of methods for applying atmospheric pressure plasma to a substrate in accordance with embodiments of the present invention. In particular, FIG. 7 represents further clarification of a step 102 of FIG. 1. Typically, atmospheric pressure plasma consists of a reactant gas and a carrier gas. The atmospheric pressure plasma may, in some embodiments, be described as light atmospheric pressure plasma. At least one advantage of atmospheric pressure plasma over conventionally utilized plasma is that atmospheric pressure plasma does not readily react with conductive regions. Thus, embodiments utilized herein may be added to a process flow without adversely affecting subsequent chemistry conditions and requirements. In some embodiments, the reactant gas is delivered in the range of approximately 1 to 3% volume of the carrier gas. In some embodiments, the reactant gas may be Oxygen, Tetrafluoromethane, or Sulfur Hexafluoride and the carrier gas may be Helium or Argon. At a first step 702, flow rate for a carrier gas is set. In some embodiments, carrier gas is delivered at a flow rate in the range of approximately 10.0 to 50.0 liters/minute (l/m), more preferably in the range of approximately 15.0 to 30.0 l/m. At a next step 704, flow rate for a reactant gas is set. In some embodiments, reactant gas is delivered at a flow rate in the range of approximately 0.1 to 1.5 l/m, more preferably in the range of approximately 0.15 to 1.00 l/m At a next step 706, RF power levels may be set. In some embodiments, RF power level is set in the range of approximately 30 to 250 watts (W), more preferably 150 to 180 W. At a next step 708, distance between plasma source and substrate is set. In some embodiments, the distance between the plasma source and the substrate is in the range of approximately 5 to 30 mm, more preferably in the range of approximately 5 to 10 mm. At a next step 710, the apparatus that includes a substrate and a plasma delivery system is brought to temperature. It may be appreciated that some processes may require extreme operating conditions that may include high temperature operations. Methods provided herein operate at much lower temperatures, which may, in some examples, reduce operator hazards. Thus, in some embodiments, temperature is less than 120° C., more preferably in the range of approximately 20 to 25° C. At a next step 712, atmospheric pressure plasma is applied to a substrate over a time interval. In some embodiments, a time interval is less than 10 seconds (s), more preferably approximately 5 s. At a next step 714, the method determines whether to continue applying atmospheric pressure plasma to a substrate. If the method determines that more processing is required, the method returns to a step 702 to set operational parameters. In some embodiments, the method returns to any of steps 702-712. Determining whether a substrate continues to be processed may be accomplished in any manner well-known in the art without departing from the present invention. It may be appreciated that proposed steps are not limited to a particular order or sequence and may be practiced in any reasonable order without departing from the present invention.

UV Radiation

Figure 8:
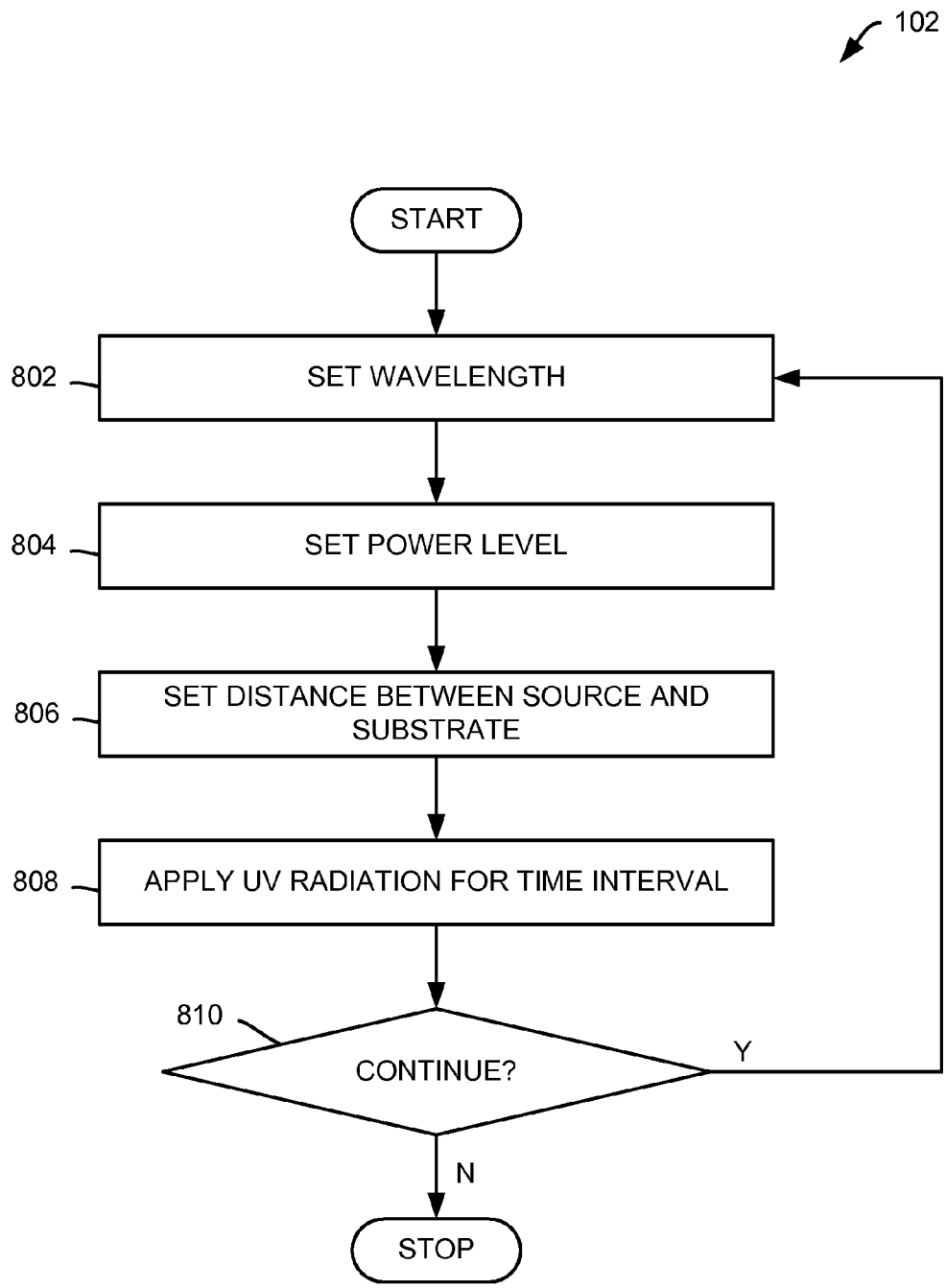
FIG. 8 is an illustrative flow chart of methods for applying UV radiation to a substrate in accordance with embodiments of the present invention.

FIG. 8 is an illustrative flow chart 800 of methods for applying UV radiation to a substrate in accordance with embodiments of the present invention. In particular, FIG. 8 represents further clarification of a step 102 of FIG. 1. At a first step 802, a desired wavelength for UV radiation is set. In some embodiments, wavelength is in the range of approximately 110 to 360 nm, more preferably 254 nm. It may be appreciated that in some embodiments, a shorter wavelength may result in a more energetic oxidation reaction. In some embodiments, a wavelength may be selected that is more or less reactive with a particular dielectric region. At a next step 804, power level of UV radiation is set. In some embodiments, power level is in the range of approximately 100 to 200 W, more preferably 150 W. At a next step 806, distance between UV source and substrate is set. In some embodiments, distance is in the range of approximately 8 to 20 mm, more preferably 10 to 12 mm. At a next step 808, a UV radiation is applied to a substrate over a time interval. In some embodiments, a time interval is in the range of approximately 60 to 240 minutes, more preferably 120 to 180 minutes.

At a next step 810, the method determines whether to continue applying UV radiation to a substrate. If the method determines that more processing is required, the method returns to a step 802 to set operational parameters. In some embodiments, the method returns to any of steps 802-808. Determining whether a substrate continues to be processed may be accomplished in any manner well-known in the art without departing from the present invention. It may be appreciated that proposed steps are not limited to a particular order or sequence and may be practiced in any reasonable order without departing from the present invention.

As may be appreciated, methods utilizing atmospheric pressure plasma and UV radiation do not require extreme operating conditions as noted above for other semiconductor processes. Thus, relatively simple, low-cost surface treatment may be achieved utilizing embodiments described herein.

In other embodiments, it may be appreciated that methods provided herein may be utilized in additional applications. For example, in some substrate process steps, an organic photoresist residue may remain on a substrate after cleaning. In some examples, narrow features such as a via or a trench may preclude a cleaning agent from properly removing photoresist residues. In those examples, embodiments that treat substrate surfaces utilizing atmospheric pressure plasma may effectively remove any remaining organic material by converting the remaining organic material to $CO_2$. In some embodiments, the reactant gas is Oxygen. In some embodiments, the temperature at which the atmospheric pressure plasma is applied is in the range of approximately 100-250° C.

In another example, where a substrate includes a molecular masking layer (MML) formed from a SAM, methods provided herein may be utilized to functionalize or cleave an MML. Methods for applying an MML may be found in U.S. patent application Ser. No. 11/647,882, which is herein incorporated by reference. An MML may be utilized to change surface characteristics of a dielectric region. For example, an MML may increase or decrease wettability of a dielectric region. An MML functions by utilizing reactive groups and linking groups—each of which may be selectively functionalized or cleaved depending on which characteristic is desired. Utilizing embodiments described herein, application of atmospheric pressure plasma may oxidize reactive or linking groups to either functionalize or cleave an MML as desired.

While this invention has been described in terms of several embodiments, there are alterations, permutations, and equivalents, which fall within the scope of this invention. It should also be noted that there are many alternative ways of implementing the methods and apparatuses of the present invention. For example, FIGS. 2-4 are not drawn to any particular scale and represent only some example structures that may benefit from embodiment described herein. Many other structures and permutations may equally benefit from embodiments described herein without departing from the present invention. Furthermore, unless explicitly stated, any method embodiments described herein are not constrained to a particular order or sequence. It is therefore intended that the following appended claims be interpreted as including all such alterations, permutations, and equivalents as fall within the true spirit and scope of the present invention.

What is claimed is:

1. A method for treating a substrate in preparation for a subsequent process, the method comprising:
   receiving the substrate, the substrate having a top surface with exposed conductive regions and dielectric regions; and
   applying an oxidizing agent to the top surface under substantially atmospheric pressure conditions in a manner such that the dielectric regions are oxidized to become increasingly hydrophilic to enable access to the conductive regions in the subsequent process, wherein the dielectric region is treated to a depth in the range of approximately 1 to 5 atomic layers, and wherein the exposed conductive regions are unaffected by the oxidizing agent.

2. The method of claim 1, further comprising processing the substrate, wherein processing the conductive regions are selectively enhanced and wherein one of the conductive regions is disposed between the dielectric regions.

3. The method of claim 1 wherein the oxidizing agent is substantially ozone free.

4. The method of claim 1 wherein the oxidizing agent is selected from the group consisting of: atmospheric pressure plasma and UV radiation.

5. The method of claim 4 wherein the atmospheric pressure plasma includes a carrier gas that is delivered at a first flow rate in a range of approximately 10 to 50 liters/minute (l/m), wherein the atmospheric pressure plasma includes a reactant gas that is delivered at a second flow rate in a range of approximately 0.1 to 1.5 l/m, wherein the atmospheric pressure plasma is applied to the substrate over a time interval less than 10 seconds (s), wherein the atmospheric pressure plasma is applied to the substrate at a distance in a range of approximately 5 to 30 mm, wherein the atmospheric pressure plasma is applied at a temperature less than 120° C., and wherein the atmospheric pressure plasma is applied at a selected RF power level in a range of approximately 30 to 250 watts (W).

6. The method of claim 5 wherein the first flow rate is in the range of approximately 15.0 to 30.0 l/m, wherein the second flow rate is in the range of approximately 0.15 to 1.0 l/m, wherein the time interval is approximately 5 s, wherein the distance is in the range of approximately 5 to 10 mm, wherein the temperature in the range of approximately 20 to 25° C., and wherein the RF power level is in the range of approximately 150 to 180 W.

7. The method of claim 5 wherein the reactant gas is selected from the group consisting of: Tetrafluoromethane, and Sulfur Hexafluoride, and wherein the carrier gas is selected from the group consisting of: Helium and Argon.

8. The method of claim 1 wherein the dielectric region is composed of a material selected from the group consisting of: SiCN, SiCNH, $SiCH_3$, $SiOCH_3$, SiH, SiCOH, porous SiCOH, SiN, SiC, SiO2, and low-κ dielectric material.

9. The method of claim 1 wherein the subsequent process is selected from the group consisting of: an aqueous process, an electrochemical deposition process, a cleaning process, a pre-chemical mechanical planarization (CMP) cleaning process, a post-CMP cleaning process, a via cleaning process, a contact cleaning process, a trench cleaning process, a metallization process, an electroless (ELESS) deposition process, an atomic layer deposition process, and a chemical vapor deposition process.

10. The method of claim 1 wherein the substrate comprises at least one of a via, a trench, or a damascene structure.

11. The method of claim 1 further comprising preparing the substrate by chemical-mechanical planarization (CMP) prior to the receiving.

12. The method of claim 1, wherein the substrate is a patterned substrate comprising one or more topographical features.

13. The method of claim 12, wherein the substrate comprises at least one of a via and a trench.

14. A method for treating a substrate in preparation for a subsequent process, the method comprising:
   receiving the substrate, the substrate having a top surface with exposed conductive regions and dielectric regions, wherein one of the conductive regions is disposed between the dielectric regions; and
   applying atmospheric pressure plasma to the top surface in a manner such that the dielectric regions become increasingly hydrophilic to enable access to the conductive regions in the subsequent process, wherein the dielectric region is treated to a depth that is less than 5 atomic layers.

15. The method of claim 14, further comprising processing the substrate, wherein processing the conductive regions is selectively enhanced.

16. The method of claim 14 wherein the atmospheric pressure plasma is substantially ozone free.

17. The method of claim 14 wherein a carrier gas of the atmospheric pressure plasma is delivered at a first flow rate in the range of approximately 15.0 to 30.0 liters/minute (l/m), wherein a reactant gas of the atmospheric pressure plasma is delivered in a second flow rate in the range of approximately 0.15 to 1.0 l/m, wherein the atmospheric pressure plasma is applied to the substrate over a time interval is approximately 5 seconds (s), wherein the atmospheric pressure plasma is applied to the substrate at a distance in the range of approximately 5 to 10 mm, wherein the atmospheric pressure plasma is applied at a temperature in the range of approximately 20 to 25° C., and wherein the atmospheric pressure plasma is applied at a selected RF power level in the range of approximately 150 to 180 W.

18. The method of claim 17 wherein the reactant gas is selected from the group consisting of: Oxygen, Tetrafluoromethane, and Sulfur Hexafluoride, and wherein the carrier gas is selected from the group consisting of: Helium and Argon.

* * * * *